United States Patent
Metzger et al.

(10) Patent No.: US 10,399,256 B1
(45) Date of Patent: Sep. 3, 2019

(54) SEALED CIRCUIT CARD ASSEMBLY

(71) Applicants: Michael A. Metzger, Bluffton, OH (US); James M. Martin, Jr., Dayton, OH (US); Paul L. Summers, Troy, OH (US)

(72) Inventors: Michael A. Metzger, Bluffton, OH (US); James M. Martin, Jr., Dayton, OH (US); Paul L. Summers, Troy, OH (US)

(73) Assignee: GOODRICH CORPORATION, Charlotte, NC (US)

( * ) Notice: Subject to any disclaimer, the term of this patent is extended or adjusted under 35 U.S.C. 154(b) by 8 days.

(21) Appl. No.: 15/955,561

(22) Filed: Apr. 17, 2018

(51) Int. Cl.
| | |
|---|---|
| *H05K 3/30* | (2006.01) |
| *B29C 35/04* | (2006.01) |
| *B29C 35/02* | (2006.01) |
| *H02K 5/10* | (2006.01) |
| *H02K 15/02* | (2006.01) |
| *H02K 15/12* | (2006.01) |
| *B29C 39/42* | (2006.01) |
| *B29L 31/34* | (2006.01) |

(52) U.S. Cl.
CPC ........ *B29C 35/041* (2013.01); *B29C 35/0227* (2013.01); *B29C 35/0288* (2013.01); *B29C 39/42* (2013.01); *H02K 5/10* (2013.01); *H02K 15/02* (2013.01); *H02K 15/12* (2013.01); *B29L 2031/3425* (2013.01); *Y10T 29/49146* (2015.01)

(58) Field of Classification Search
CPC ... B29C 35/041; B29C 39/42; B29C 35/0288; B29C 35/0227; H02K 5/10; H02K 15/12; H02K 15/02; H01L 23/053; H03K 17/945; B29L 2031/3425; Y10T 29/4913; Y10T 29/49146
USPC .................................................. 29/832, 841
See application file for complete search history.

(56) References Cited

U.S. PATENT DOCUMENTS

| | | | |
|---|---|---|---|
| 3,413,391 | A | 11/1968 | Carrol et al. |
| 3,937,855 | A | 2/1976 | Gruenwald |
| 4,144,836 | A | 3/1979 | Bernath |
| 4,384,014 | A | 5/1983 | Young |

(Continued)

FOREIGN PATENT DOCUMENTS

| | | |
|---|---|---|
| AU | 2003210709 | 9/2003 |
| CA | 2104487 | 3/1994 |

(Continued)

*Primary Examiner* — Donghai D Nguyen
(74) *Attorney, Agent, or Firm* — Snell & Wilmer L.L.P.

(57) ABSTRACT

A method of manufacturing a sealed circuit card assembly includes disposing a circuit card assembly within a volume defined by a housing and at least partially filling the volume with a curable liquid such that the curable liquid encapsulates at least a circuit card. The method may also include curing the curable liquid to form a potted circuit card assembly and, after at least partially filling the volume with the curable liquid and after curing the curable liquid, vacuum impregnating the potted circuit card assembly with a sealant to seal any exposed interfaces or cracks to form the sealed circuit card assembly. Accordingly, the sealed circuit card assembly may include a first cured material encapsulating the circuit card of the circuit card assembly and a second cured material disposed within, for example, a porosity of the first cured material.

9 Claims, 4 Drawing Sheets

(56) References Cited

U.S. PATENT DOCUMENTS

| | | | | |
|---|---|---|---|---|
| 4,731,644 | A | * | 3/1988 | Neidig .................. H01L 23/053 |
| | | | | 257/687 |
| 5,028,905 | A | | 7/1991 | Lostumo |
| 5,670,203 | A | | 9/1997 | Terhardt et al. |
| 7,145,348 | B2 | * | 12/2006 | Nakazaki ............. H03K 17/945 |
| | | | | 361/818 |
| 7,684,146 | B1 | | 3/2010 | Andrikowich et al. |
| 8,821,778 | B2 | | 9/2014 | Kraus |
| 9,780,618 | B1 | | 10/2017 | Hanks et al. |
| 2015/0145351 | A1 | | 5/2015 | Porcher et al. |

FOREIGN PATENT DOCUMENTS

| | | |
|---|---|---|
| CA | 2474359 | 8/2003 |
| CA | 2637812 | 11/2007 |
| CN | 101802631 | 10/2014 |
| CN | 104595157 | 5/2015 |
| MX | 2014001442 | 9/2014 |

\* cited by examiner

SEALED CIRCUIT CARD ASSEMBLY

FIELD

The present disclosure relates to circuit cards, and more particularly to sealing circuit card assemblies.

BACKGROUND

Electronic assemblies, connectors, and wire bundle assemblies are utilized in a variety of industries to electronically communicate with various components of a system. For example, many aircraft typically include numerous sensors and effector systems whereby vehicle functions are controlled and monitored, and such systems typically include electrical wiring to conduct power and signals among different system components of the aircraft. One such system, for example, is a brake system of an aircraft. The brake assembly of a brake system may be exposed to harsh environments and/or may operate under extreme conditions, such as varying temperatures and pressures. Further, these systems may experience vibrations and may be exposed to corrosive liquids, etc. Conventional wire bundle assemblies are often susceptible to failure caused by moisture ingress, which can corrode or otherwise damage an active circuit card.

SUMMARY

In various embodiments, the present disclosure provides a method of manufacturing an electronic assembly, such as a sealed circuit card assembly. The method may include disposing a circuit card assembly within a volume defined by a housing. The method may also include at least partially filling the volume with a curable liquid such that the curable liquid at least partially encapsulates at least a circuit card of the circuit card assembly, and potentially additional interface wiring. The method may also include curing the curable liquid to form a potted circuit card assembly and, after at least partially filling the volume with the curable liquid and after curing the curable liquid, vacuum impregnating the potted circuit card assembly with a sealant to seal any exposed interfaces or cracks and form the sealed circuit card assembly.

In various embodiments, vacuum impregnating the potted circuit card assembly comprises a dry vacuum step, a sealant introduction step, and a pressurization step. In various embodiments, the curable liquid is a first curable liquid (that is cured to form the first cured material), the sealant is a second curable liquid, and vacuum impregnating the potted circuit card assembly includes at least one of occupying the porosity of the first cured material with the second curable liquid, sealing exposed cracks or interfaces with the second curable liquid, and curing the second curable liquid. In such embodiments, curing the first curable liquid may include cross-linking the first curable liquid before vacuum impregnating with the sealant. In various embodiments, the method further includes extending wires through the potting to the circuit card of the circuit card assembly. Additionally, wires may pass through the circuit card of the circuit card assembly (e.g., the wires may be pass-through wires). For example, the circuit card may include an annular shape, or may define a central pass-through bore through which the pass-through wires extend. In various embodiments, the housing is a banding backshell assembly. The method may also include coating the circuit card of the circuit card assembly with a layer of conformal coating before at least partially filling the volume with the curable liquid. Still further, the method may include coupling the sealed circuit card assembly to a wire bundle assembly that extends between an electric brake actuator controller and an electric brake actuator.

Also disclosed herein, according to various embodiments, is a sealed circuit card assembly that includes a housing defining a volume and a circuit card assembly at least partially disposed in the volume, wherein the circuit card assembly comprises a circuit card. The sealed circuit card assembly may further include a first cured material encapsulating the circuit card of the circuit card assembly and a second cured material disposed within at least one of porosity of the first cured material and space between the first cured material, the circuit card assembly, possible interface wires, and the housing.

In various embodiments, the housing is a banding backshell assembly and the banding backshell assembly may be coupled to a conduit of a wire bundle assembly that extends between an electric brake actuator controller and an electric brake actuator. In various embodiments, the first cured material has a first hardness rating and the second cured material has a second hardness rating, with the first hardness rating being greater than the second hardness rating. In various embodiments, the second cured material has a first flexibility rating and the second cured material has a second flexibility rating, wherein the first flexibility rating is less than the second flexibility rating.

Also disclosed herein, according to various embodiments, is a brake assembly that includes an electric brake actuator, a wire bundle assembly extending between an electric brake actuator controller and the electric brake actuator, and a sealed circuit card assembly. The sealed circuit card assembly includes a banding backshell defining a volume and a circuit card assembly at least partially disposed in the volume, wherein the circuit card assembly comprises a circuit card. The sealed circuit card assembly also includes a first cured material encapsulating the circuit card of the circuit card assembly and a second cured material disposed within at least one of porosity of the first cured material and space between the first cured material, the circuit card assembly, and the banding backshell.

The forgoing features and elements may be combined in various combinations without exclusivity, unless expressly indicated herein otherwise. These features and elements as well as the operation of the disclosed embodiments will become more apparent in light of the following description and accompanying drawings.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Disclosed herein, according to various embodiments, is a sealed circuit card assembly and its method of manufacture. The sealed circuit card assembly and its related method of manufacture, as described in greater detail below, may be implemented in various types of electrical connection systems. For example, the sealed circuit card assembly may be implemented in a brake assembly of an aircraft.

Figure 1:
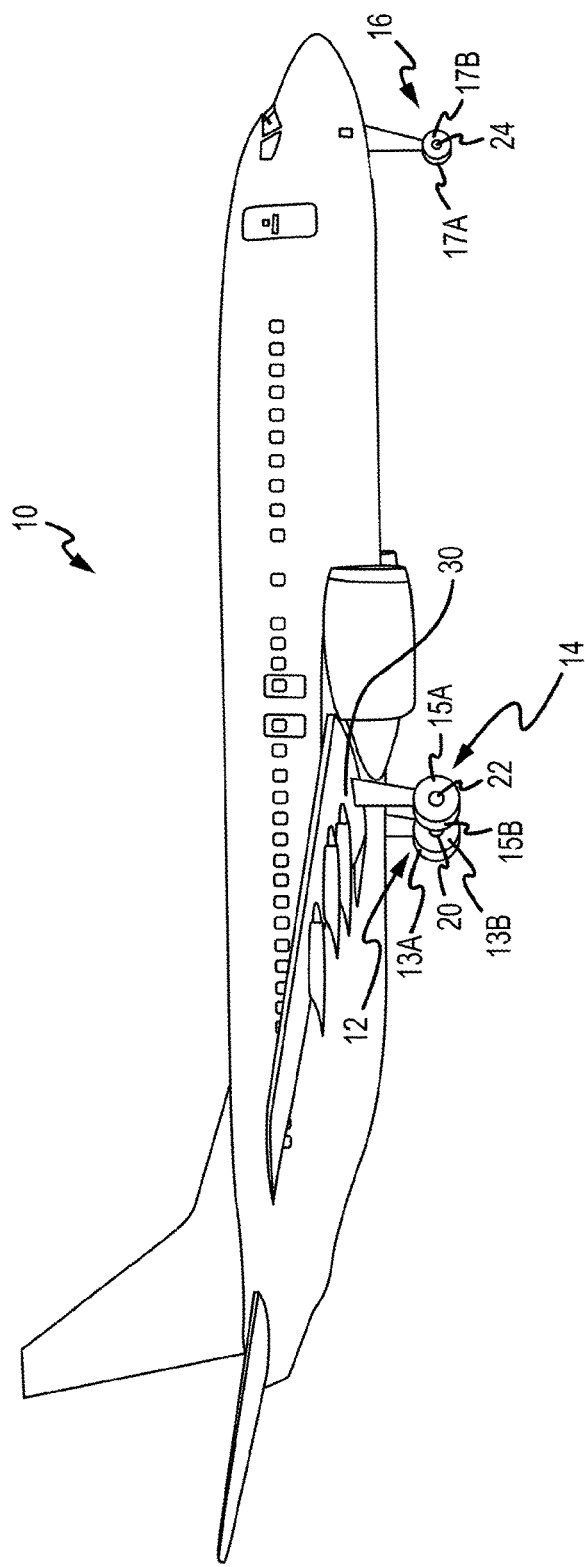
FIG. 1 illustrates an aircraft, in accordance with various embodiments.

Referring now to FIG. 1, in accordance with various embodiments, an aircraft 10 may include landing gear such as main landing gear 12, main landing gear 14 and nose landing gear 16. Main landing gear 12, main landing gear 14, and nose landing gear 16 may generally support aircraft 10 when aircraft 10 is not flying, allowing aircraft 10 to taxi, take off and land without damage. Main landing gear 12 may include wheel 13A and wheel 13B coupled by an axle 20. Main landing gear 14 may include wheel 15A and wheel 15B coupled by an axle 22. Nose landing gear 16 may include nose wheel 17A and nose wheel 17B coupled by an axle 24. In various embodiments, aircraft 10 may comprise any number of landing gears and each landing gear may comprise any number of wheels. Main landing gear 12, main landing gear 14, and nose landing gear 16 may each be retracted for flight.

Figure 2:
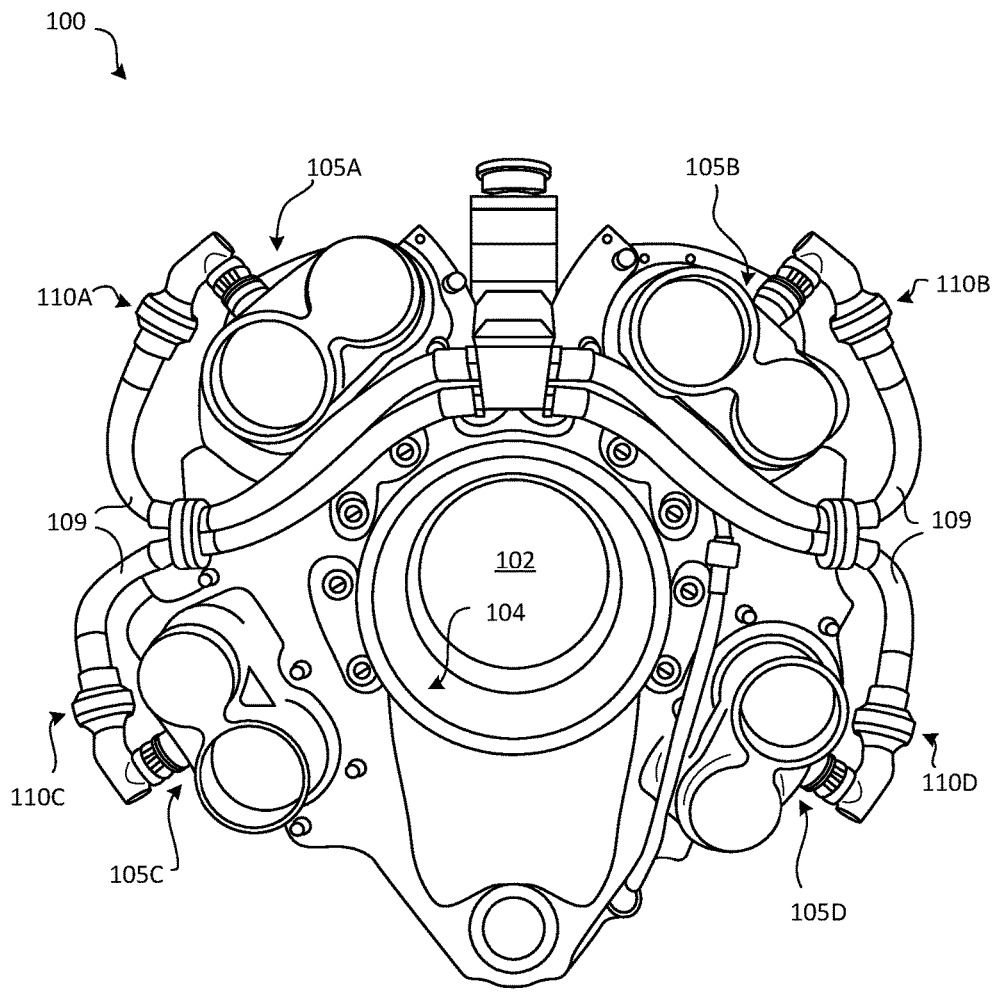
FIG. 2 illustrates a perspective view of a brake assembly, in accordance with various embodiments.

In various embodiments, and with reference to FIGS. 1 and 2, aircraft 10 may also include a brake assembly 100, which may be coupled to a landing gear of the aircraft 10 and configured to control braking at the wheels of the landing gear. The brake assembly 100 may be controlled by an electric brake actuator controller ("EBAC") that communicates with one or more electric brake actuators 105A, 105B, 105C, 105D (generally, "electric brake actuator 105") to control the braking force and/or torque applied at each wheel (e.g., wheel 13A, wheel 13B, wheel 15A, and/or wheel 15B, etc.). Control signals may be communicated to the electric brake actuators 105 via one or more wire bundle assemblies 109. The wire bundle assemblies 109 may include one or more sealed circuit card assemblies 110A, 110B, 110C, 110D (generally, "sealed circuit card assembly 110"). As described in greater detail below with reference to FIGS. 3 and 4, the sealed circuit card assembly 110 includes a dual protective composition to prevent or at least inhibit moisture ingress to the active circuit card 113 (FIG. 3) of the sealed circuit card assembly 110.

The brake assembly 100 may be mounted to each wheel to apply and release braking force on one or more wheels (e.g., as described above). The brakes of an aircraft 10 may include a non-rotatable wheel support, a wheel (e.g., wheel 13A, wheel 13B, wheel 15A, and/or wheel 15B) mounted to the wheel support for rotation, and a brake disk stack. For example, an axle may extend through hole 102 and the brake stack may be disposed in area 104 and may have alternating rotor and stator disks mounted with respect to the wheel support and wheel for relative axial movement. Each rotor disk may be coupled to the wheel for rotation therewith, and each stator disk may be coupled to the wheel support against rotation. A back plate may be located at the rear end of the disk stack and a brake head may be located at the front end. The electric brake actuators 105 may include or communicate with one or more rams that extend to compress the brake disk stack against the back plate, or the brake disk stack may be compressed by other means. Torque is taken out by the stator disks through a static torque tube or the like.

Figure 3:
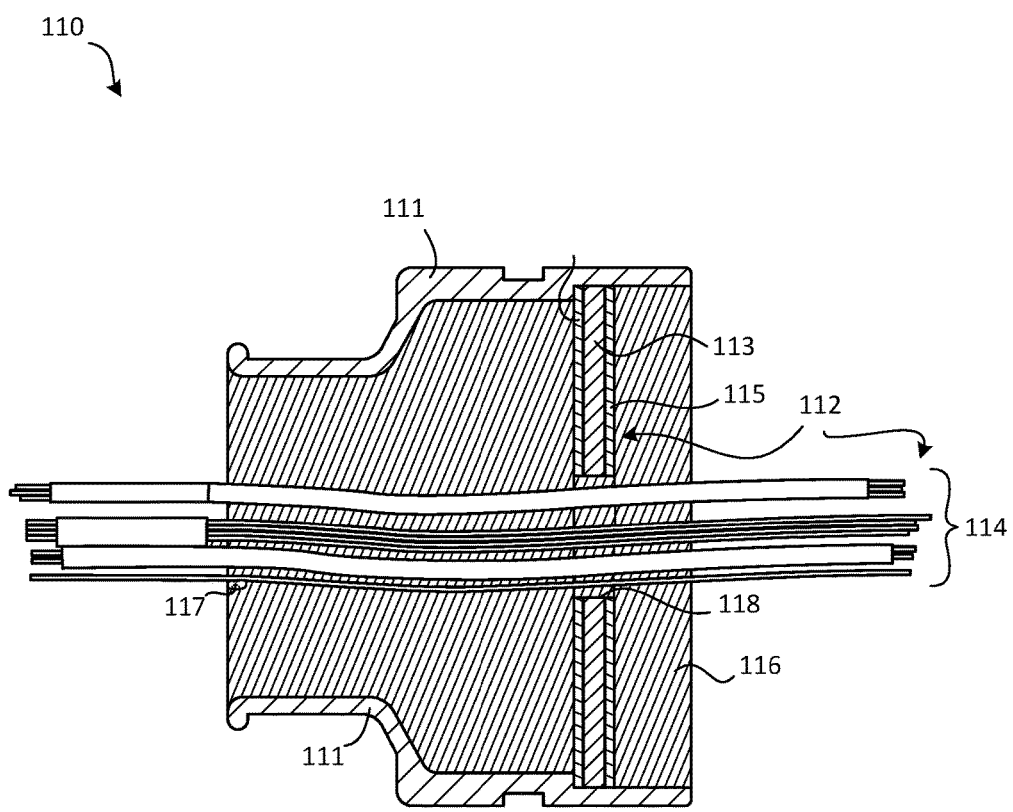
FIG. 3 illustrates a cross-sectional schematic view of a sealed circuit card assembly in its retaining housing, in accordance with various embodiments.

In various embodiments, and with reference to FIG. 3, a sealed circuit card assembly 110 is provided. The sealed circuit card assembly 110 includes a housing 111 that defines a volume (which is the space between opposing walls of the housing 111 that is occupied by the internal components depicted in FIG. 3). The housing 111 may be a permanent portion of the sealed circuit card assembly 110, or the housing 111 may be temporary and thus may be removed after curing a curable liquid. The housing 111 may be a banding backshell of wire bundle assembly 109. That is, the housing 111 may be a portion of a conduit of the wire bundle assembly 109. The sealed circuit card assembly 110 also comprises a circuit card assembly 112, which includes a circuit card 113 that may be wireless or may include one or more electrical wires 114. Thus, the term "circuit card assembly 112" generally refers to the electrical components retained within the housing 111 and the term "sealed circuit card assembly 110" generally refers to the overall assembly that includes the housing 111, the circuit card assembly 112, and two types of cured materials that facilitate fluid isolation of the electrical components from the extreme and/or harsh operating environment/conditions of the brake assembly 100 of aircraft 10, according to various embodiments. The two types of cured materials of the sealed circuit card assembly 110 include a first cured material 116 and a second cured material 117. The second cured material 117 is schematically represented in FIG. 3, and thus the size and location of the second cured material 117 depicted in FIG. 3 is not indicative of the size and location of an implemented second cured material 117. That is, the second cured material 117, as described in greater detail below, is generally configured to occupy the porosity, any exposed interfaces or cracks, and other potential fluid leak paths of the first cured material 116, thereby improving the fluid seal and inhibiting moisture ingress to the circuit card assembly 112.

In various embodiments, the circuit card 113 is configured to be positioned within the housing 111 (e.g., at least partially disposed in the volume defined by the housing 111). The circuit card 113 may include a printed circuit board (PCB). The printed circuit board may have a shape that conforms to the internal cross-sectional shape of the volume defined by the housing 111. For example, the circuit card 113 may be a round wafer and may be fit within a cylindrical housing 111. In various embodiments, however, the circuit card 113 may be trapezoidal, triangular, irregularly shaped, oval, and/or any shape as desired.

The circuit card 113 may include various regions, such as a conductor interface region and a populated region. The conductor interface region may include a region of the circuit card 113 that has conductor contacts that are each configured to receive a conductor in electrical communication with the circuit card 113. For instance, a conductor contact may comprise a solder pad, or a through hole, or a lug, or a tab, or a flange, or a fastener, and/or any other mechanism whereby electrical continuity between a conductor and the conductor contact (and thus the circuit card 113) may be established. The circuit card 113 may be wireless and thus may not have conductor contacts for interface wiring. The populated region may be the region of the circuit card 113 that is populated or that is configured to be populated with electronic components, such as any number of active electronic components and/or passive electronic components. For instance, integrated circuits, resistors, capacitors, inductors, switches, semiconductor devices such as diodes and/or transistors, microprocessors, memories, amplifiers, and/or the like may populate the populated region of the circuit card 113. The circuit card 113 may include wires and/or other electrical connectors that extend within and between the regions of the circuit card 113.

The circuit card 113 may have an annular shape, and thus may define and/or include a central pass-through bore 118. The central pass-through bore 118 may be an opening disposed through the circuit card 1 and positioned radially inwardly of the populated region. In various embodiments, the central pass-through bore 118 may be configured to permit pass-through wires 114 or other aspects of an electrical connector to extend there through, such as connector pins, connector sockets, back shell components, and/or the like. The central pass-through bore 118 may have any desired shape, such as quadrilateral, trapezoidal, circular, oval, star shaped, or may be any shape as desired. The pass-through wire(s) 114 may be insulated/jacketed wire(s).

The circuit card 113 may be an active component and may be configured to condition or otherwise control signals and/or power conducted along the wire bundle assembly 109 (FIG. 2). Accordingly, electronic circuitry may be efficiently packaged within the cured potting region. If the housing 111 is permanent, the circuit card 113 may be coupled to the housing 111 using an adhesive, or the first cured material 116 may facilitate the retention of the circuit card 113 to the housing 111. In various embodiments, the circuit card 113 is press-fit against a portion of the housing 111. In various embodiments, the circuit card 113 may be coated with a conformal coating 115 before the first cured material 116 is formed within the housing 111. The conformal coating 115 may be a layer that extends over various regions of the circuit card 113 to function as an additional moisture barrier, and/or may have dielectric properties, adhesive properties, and/or the like. The conformal coating may be made from a silicone material, rubber, synthetic rubber, a poly(p-xylylene) polymer, acrylic, polyurethane, or other polymeric materials, among others. For instance, the conformal coating 115 may be a halogenated parylene, a reactive parylene, or any desired parylene. For instance, the conformal coating 115 may comprise parylene N, or parylene C, or parylene X, or any parylene having properties as desired. In various embodiments, the circuit card 113 is conformally coated prior to bonding the circuit card 113 to the housing 111. Alternatively, the circuit card 113 may be coated with the conformal coating 115 after the circuit card 113 has been coupled to the housing 111.

In various embodiments, and with continued reference to FIG. 3, the first cured material 116 substantially encapsulates the circuit card 113. The first cured material 116, which may be an epoxy material or other such material, functions as a primary seal for the assembly. That is, the circuit card assembly 112 may be "potted" (as described below with reference to the method of FIG. 4) to provide a primary fluid seal to the assembly. That is, the first cured material 116 may be formed/cured within the housing 111 and around the circuit card assembly 112 before the second cured material 117 is formed/cured to occupy any porosity and to act as a sealant against any exposed interfaces or cracks. Accordingly, the term "potted circuit card assembly" refers to an intermediate stage of the circuit card assembly before the second cured material 117 has been formed. Thus, while the first cured material 116 may provide mechanical retention, electric insulation, and at least a degree of fluid sealing, imperfections in the first cured material 116 and/or imperfections between the interfaces of the first cured material 116, the housing 111, any potted wiring, and the circuit card assembly 112 may result in fluid leak paths that can compromise the structural and operational integrity of the circuit card 113.

Accordingly, the second cured material 117 generally occupies the pores, cracks, gaps, or other such imperfections of the potted circuit card assembly. That is, the second cured material 117 fills in the porosity of the first cured material 116 and/or fills in the gaps/cracks between the housing 111, any potted wiring, the circuit card assembly 112, and the first cured material 116. For this reason, the second cured material 117 is merely shown schematically in FIG. 3, as the second cured material 117 may actually be dispersed throughout the assembly and may be located in the cracks and pores of the first cured material 116 and along the interfaces of the first cured material, the housing 111, any potted wiring, and the circuit card assembly 112 (i.e., the circuit card 113 itself and/or the pass-through wire(s) 114). In various embodiments, the second cured material 117 may be formed using a vacuum impregnation process, as described below with reference to FIG. 4.

In various embodiments, the first cured material 116 is an epoxy material. For example, the first cured material may be Dolf, S1125. In various embodiments, the second cured material 117 is a methacrylate, a silicate, or an epoxy material. For example, the second cured material 117 may be methyl-methacrylate.

In various embodiments, the first cured material 116 has a first hardness or durometer rating and the second cured material 117 has a second hardness or durometer rating, with the first hardness rating being greater than the second hardness rating. Said differently, the first cured material 116 may have a first flexibility rating and the second cured material 117 may have a second flexibility rating, with the first flexibility rating being less than the second flexibility rating. That is, the first cured material 116 may be stiffer than the second cured material 117. Accordingly, the first cured material 116 may provide mechanical retention while the second cured material 117 may provide, in addition to the aforementioned sealing benefits, a degree of flexibility to the sealed circuit card assembly 110, thereby preventing or at least inhibiting the formation of cracks and other fluid leak paths that would otherwise result if only the rigid/stiff first cured material 116 were implemented. That is, because of the different coefficients of thermal expansion of the different materials involved (e.g., the housing 111 may be a metallic material while the first cured material 116 may be a polymer material), the assembly would be susceptible to structural fracturing were it not for the relatively more flexible second cured material 117 that is able to absorb a portion of the mechanical load resulting from the relative thermal expansion and contraction of the components.

Figure 4:
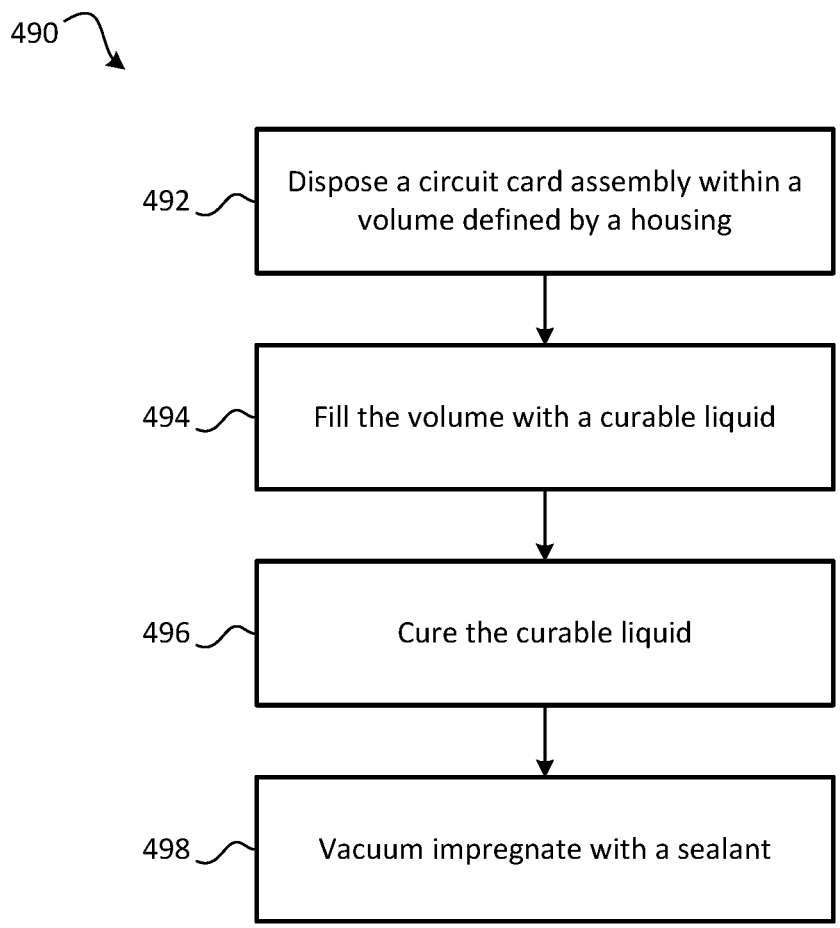
FIG. 4 is a schematic flow chart diagram of a method of manufacturing a sealed circuit card assembly, in accordance with various embodiments.

In various embodiments, and with reference to FIG. 4, a method 490 of manufacturing the sealed circuit card assembly 110 is provided. The method 490 may include disposing the circuit card assembly 112 within the volume defined by the housing 111 at step 492. The method 490 may further include filling the volume with a curable liquid (e.g., the precursor to the first cured material 116) at step 494 and then curing the curable liquid at step 496 to form the first cured material 116. Still further, the method 490 may include vacuum impregnating with a sealant (e.g., the precursor to the second cured material 117) at step 498. In various embodiments, step 494 includes at least partially filling the volume with the curable liquid, which as described above may be an epoxy or other such material, such that the curable liquid encapsulates the circuit card 113 of the circuit card assembly 112. In various embodiments, steps 492, 494, and 496 are performed in the order shown, which results in the formation of the potted circuit card assembly (e.g., an intermediate stage). In various embodiments, step 498 may occur after steps 494 and 496, and step 498 may result in the formation of the sealed circuit card assembly 110 (e.g., step 498 turns the potted circuit card assembly into the sealed circuit card assembly 110).

In various embodiments, step 498 may include a subsequent curing step. In various embodiments, step 498 may include a dry vacuum step, a sealant introduction step, and a pressurization step. In various embodiments, the curable liquid of step 494 may be a first curable liquid and the sealant of step 498 may be a second curable liquid. Accordingly, step 498 may include a subsequent curing step to cure the second curable liquid. In various embodiments, the process of curing may include cross-linking the curable materials. That is, the first curable liquid may be cross-linked before step 498, or the first curable liquid and the second curable liquid may be cross-linked with each other. In various embodiments, the method 490 may further include coating the circuit card 113 with the conformal coating 115 before step 494.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Also, any reference to attached, fixed, connected, coupled or the like may include permanent (e.g., integral), removable, temporary, partial, full, and/or any other possible attachment option. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of manufacturing an electronic assembly, the method comprising:
   disposing a circuit card assembly within a volume defined by a housing;
   at least partially filling the volume with a first curable liquid such that the first curable liquid encapsulates at least a circuit card of the circuit card assembly;
   curing the first curable liquid to form a potted circuit card assembly, wherein curing the first curable liquid forms a first cured material; and
   after at least partially filling the volume with the first curable liquid and after curing the first curable liquid to form the first cured material, vacuum impregnating the potted circuit card assembly with a sealant to form a sealed circuit card assembly, wherein the first curable liquid and the sealant are different materials, wherein vacuum impregnating the potted circuit card assembly with the sealant comprises occupying porosity of the first cured material with the sealant.

2. The method of claim 1, wherein vacuum impregnating the potted circuit card assembly comprises a dry vacuum step, a sealant introduction step, and a pressurization step.

3. The method of claim 1, wherein:
the sealant is a second curable liquid; and
vacuum impregnating the potted circuit card assembly further comprises curing the second curable liquid, wherein curing the second curable liquid forms a second cured material.

4. The method of claim 3, wherein the first cured material comprises a first flexibility rating and the second cured material comprises a second flexibility rating, wherein the first flexibility rating is less than the second flexibility rating.

5. The method of claim 3, wherein the first cured material comprises a first hardness rating and the second cured material comprises a second hardness rating, wherein the first hardness rating is greater (harder) than the second hardness rating.

6. The method of claim 5, further comprising coating the circuit card of the circuit card assembly with a layer of conformal coating before at least partially filling the volume with the first curable liquid.

7. The method of claim 1, further comprising at least one of extending wires into the circuit card of the circuit card assembly, extending wires from the circuit card of the circuit card assembly, and extending pass-through wires through the circuit card of the circuit card assembly.

8. The method of claim 7, wherein the circuit card comprises an annular shape and defines a central pass-through bore through which the pass-through wires extend.

9. The method of claim 1, further comprising coupling the sealed circuit card assembly to a wire bundle assembly that extends between an electric brake actuator controller and an electric brake actuator.

* * * * *